United States Patent [19] … [11] Patent Number: 4,525,852
Rosenberg … [45] Date of Patent: Jun. 25, 1985

[54] ALIGNMENT APPARATUS

[75] Inventor: Lawrence M. Rosenberg, San Jose, Calif.

[73] Assignee: Micronix Partners, Los Gatos, Calif.

[21] Appl. No.: 475,420

[22] Filed: Mar. 15, 1983

[51] Int. Cl.³ .................. G05G 11/00; G21K 5/00; A47B 11/00
[52] U.S. Cl. .................. 378/34; 74/479; 250/491.1; 378/205
[58] Field of Search .................. 378/34, 35, 205, 208; 250/491.1; 74/479

[56] References Cited

U.S. PATENT DOCUMENTS

| | | | |
|---|---|---|---|
| 4,239,144 | 12/1980 | Elles et al. | 74/479 |
| 4,335,313 | 6/1982 | Kreuzer et al. | 378/34 |
| 4,403,336 | 9/1983 | Taniguchi et al. | 378/35 |
| 4,409,860 | 10/1983 | Moriyama et al. | 74/479 |
| 4,475,223 | 10/1984 | Taniguchi et al. | 378/34 |

Primary Examiner—Alfred E. Smith
Assistant Examiner—T. N. Grigsby
Attorney, Agent, or Firm—Thomas S. MacDonald; Alan H. MacPherson

[57] ABSTRACT

Alignment apparatus particularly for a semiconductor wafer (140) includes a horizontal support plate (134), a horizontal rotatable theta plate (106) below the support plate and a horizontal x-y motion plate below the rotatable plate. Three piezoelectric linear drive motors (128-130) are mounted depending from the rotatable plate and having linear shafts (128a, etc.) extending thereabove to support the support plate, drive the support in the z-axis and then differentially operated to tilt the support plate. A pair of linear piezoelectric motors (110,115) drive the motion plate in x- and y-directions. A theta drive linear piezoelectric motor (137) functions to rotate the theta plate (106). Flexure connections (113, 117, 119, 121, 138, 144) are provided between the various motors and plates. Mask registration means (124, 125) extends upwardly past the edges of the plates to initially gap the wafer-to-mask distance. The mask (150) is held in a separate aligner (153) above the wafer (14) mounted on the support plate. The assembly of six piezoelectric motors and flexural linkages provides for movement of a wafer in six degrees of freedom.

20 Claims, 4 Drawing Figures

ALIGNMENT APPARATUS

CROSS-REFERENCES TO RELATED APPLICATIONS

This invention relates to and is useful in the lithography system shown in U.S. patent application Ser. No. 475,430 filed Mar. 15, 1983 entitled "Lithography System" by W. Thomas Novak, Inventor, and may be utilized with that invention shown in U.S. application Ser. No. 475,427 filed Mar. 15, 1983, entitled "Mask Alignment Apparatus" by Anwar Husain, Inventor, each filed concurrently herewith and assigned to the assignee of this application. The subject matter of each of the above-identified co-pending applications is incorporated herein by reference.

BACKGROUND OF THE INVENTION

1. Field of the Invention

This invention relates to alignment apparatus, and more particularly, to an apparatus to adjust a holding means for a semiconductor wafer or other substrate as needed for extremely accurate positioning with respect to a mask used in the fabrication of semiconductor or other devices from the wafer or substrate.

The invention has particular utility in X-ray lithography printing processes wherein the wafer, covered with photosensitive material, and a mask(s) of the circuit to be made, are brought into registration. The wafer is mounted on a movable support plate or stage which is translated in x-y axis directions, in rotation $\theta$, in mask-wafer gap spacing and in tilting or angular orientations with respect to the mask.

2. Description of the Prior Art

The X-ray lithography system in which the alignment stage of this invention finds general utility is seen in U.S. Pat. Nos. 4,037,969 and 4,326,805 wherein zone patterns are formed on spaced-apart mask and wafer(s) and are used for alignment purposes in the fabrication of integrated circuits. Off-axis illumination of the patterns is provided affording a significant mask-to-wafer alignment capability in the x and y axis, in rotation $\theta$, and in the gap space between the wafer and mask. The zone plate patterns serve as a basis for adjusting the mask-to-wafer separation. U.S. Pat. No. 3,870,416 describes a wafer alignment device useful in the above prior art systems which comprises a support platform supported by three flexible rods extending to a linking ring. Three additional rods extend from the ring to a stationary table. The support platform is movable in the x, y and $\theta$ directions to align the wafer without movement in the Z direction. Forces to move the support platform are applied at midpoint between the platform and the lower linking ring by piezoelectric transducers applied to a hollow cylinder extending downwardly from the support platform. The ring is located in a reservoir of viscous fluid to damp vibrations during adjustment and scanning. Other support platforms have been utilized in X-ray lithograph systems but are very large and cumbersome having an envelope size up to 48"×48".

SUMMARY

The invention is directed to an improved, extremely compact alignment apparatus which is capable of aligning an object, particularly a semiconductor wafer mounted on a support plate or chuck within six degrees of freedom. It utilizes a pair of parallel substantially horizontal plates, namely a rotatable or theta plate and an x-y motion plate, positioned below the support plate and a series of piezoelectric motors mounted between the plates to accurately drive the plates variously in x, y, z, $\theta$ and in tilting motions. Plate motion is permitted via flexure bearings resulting in an overall stage which can hold a wafer or other object rigidly with virtually no backlash yet move the stage in six degrees of freedom to perform total alignment of the wafer at extreme resolutions of the order of 0.05 microns.

The support plate is supported at three points by three vertically mounted piezoelectric motors which can tilt the support plate in two axes or move the support plate and mounted wafer in the Z (up and down) direction to accommodate wafers of various thicknesses and to alter the mask-to-wafer gap.

The rotatable theta plate and x-y motion plate are driven by three horizontally aligned piezoelectric motors positioned underneath the x-y motion plate. These motors are connected to edges of their respective plates by bell crank linkages with flexure bearings. Means are provided for coarse aligning the overall assembly of three plates in the Z direction. Each of the plates are of a different peripheral shape so as to allow the described multiple motions and to allow passage of vertical mask registration means which initially sets the wafer-to-mask gap. In an operative embodiment this is 40 microns. The overall coarse and fine alignment stages are contained in a housing of only 8 inches square.

The alignment apparatus is used in conjunction with a mask alignment apparatus which extends in a generally parallel plane spaced above the mounted wafer. The wafer is aligned by the described system with respect to the mask so as to provide extremely accurate registration therewith as necessary for the fabrication of semiconductor structures by printing processes having geometries of 0.5 micrometers or smaller.

DETAILED DESCRIPTION

Figure 1:
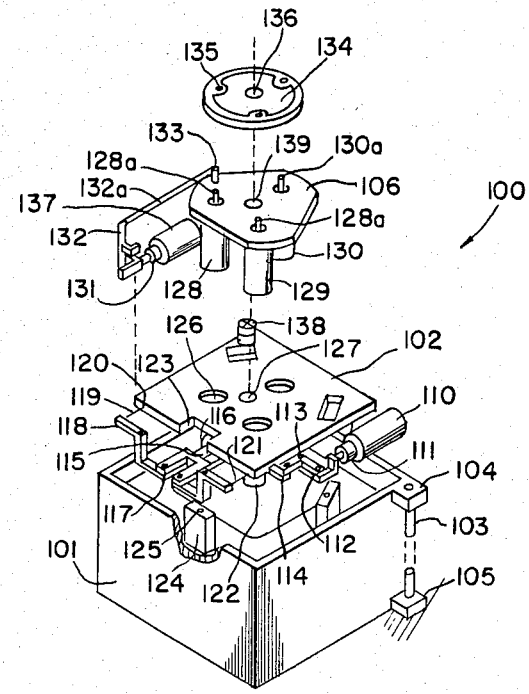
FIG. 1 is an exploded, partially cut-away perspective view of the alignment apparatus.

The alignment apparatus 100 shown in FIG. 1 is alternately designated herein as a wafer stage since its principle application has been in aligning a semiconductor wafer, in which multiple semiconductor integrated circuits are to be fabricated using photolithography processes, with one or a series of masks used in the fabrication. The apparatus is contained in a rectangular stage housing 101 which is capable of up and down coarse movement for raising and lowering the overall stage, including the housing, about three inches to allow for wafer and mask loading and unloading. At the top of this motion in the Z-direction the hereafter described fine stage is kinematically located, i.e., has essentially perfect position repeatability.

A rectangular, essentially square x-y motion plate 102 is mounted in housing 101 and supported on a series of three air bearings 122. The housing and supported motion plate 102 is moved upwardly in the coarse Z direction by a coarse Z motor 149 and lead screw 146 (FIG. 2), the housing being guided vertically by a pair of guide rods 103 extending vertically from a fixed support pad 105. The rods extend through a pair of apertured tabs 104 on opposite edges of the housing 101.

An X-drive piezoelectric linear motor 110 is attached to a vertical side wall 109 on the inside of housing 101 and extends parallel to that wall. The linear moving shaft 111 of the motor is connected to one end of a bell crank linkage 112, flexurally pivoted at 113 and connected at its opposite end to a tab 114 extending perpendicularly from an edge of motion plate 102. Linear incremental movement of shaft 111 results in incremental linear movement of the motion plate in the X-axis.

The piezoelectric motors used in this invention output incremental movements of the order of 60 Angstroms. A commercial embodiment of this type of motor is Model PZ-500 known as the Burleigh Inchworm, available from Burleigh Instruments, Fishers, N.Y. This type motor is highly stable in the "off" condition so that it will, after adjustment, dependably lock the wafer into position.

A Y-drive piezoelectric motor 115 is mounted to a bar extending across housing 101 but affixed to the upper surface of housing 101 and has its linearly movable shaft 116 connected to a U-shaped bell crank 117. The crank is connected at its ends to pivots 117a and 117b and links 118, centrally pivoted in flexures 108, are attached at their outer ends to flexures 119 and 121. Flexures 119 and 121 extend into a vertical edge 120 of the motion plate and are flexed when the X-axis motor is operated to move the motion plate in the X-direction and have sufficient stiffness to act as push-pull rods when the Y-axis motor is operated to move the motion plate in the Y-direction.

Motion plate 102 contains three rectangular equispaced cut-outs 123 around its periphery through which pass three vertical mask registration alignments blocks 124, each having a mask registration pad 125 which abuts the underside of a mask assembly (FIG. 4) positioned above the wafer. Motion plate 102 also contains three equispaced circular apertures 126 through which pass vertically oriented Z-drive piezoelectric linear motors 128, 129 and 130. A central aperture 127 receives a bottom end of a theta flexural pivot 138, the other end of which is mounted in aperture 139.

Motors 128-130 are fixedly mounted in depending vertical position on the underside of lobes of a trilobed rotatable theta plate 106. The linear movable shafts 128a, 129a and 130a extend above theta plate 106 to support pads 135 on the underside of wafer-support plate or chuck 134. Motors 128-130 when moved in unison move the wafer in the Z-direction to accommodate wafers of various thickness and to alter the wafer-to-mask gap. When only one or two motors are moved, the plate may be tilted in two axes to compensate for any distortions in the wafer or mask, or in the parallelity between the wafer and mask. Flexures connect the linear moving shafts 128a, 129a and 130a to zero clearance bearings 147 (FIG. 2) captured in the chuck 134 thus permitting angular tilt of the wafer chuck without inducing large bending movements into the linear shafts.

A linear variable differential transformer 158 (LVDT) available from Schaevitz Engineering, Pennsauken, N.J., as Model PAC-220-005, is positioned adjacent to each of the shafts of motors 128-130 which contact the rear of the chuck 134 to sense and control through a closed loop system (not shown) the axial travel of the piezomotors to about 0.2 micron resolution.

A theta-drive piezoelectric linear motor 137 is connected across the walls of the housing 101 in parallel orientation with the x-and-y drive motors which motors are all contained in a common horizontal plane below motion plate 102. Linear moving shaft 131 of motor 137 is connected to a bell crank flexural linkage 132 extending upwardly past the edge of the theta plate to an arm 132a attached to a fixed post 133 on the top of the theta plate. Movement of the link 132a resultant from incremental movement of shaft 131 results in rotative theta movement of plate 106 clockwise or counterclockwise in plan view around flexural pivot 138 which in turn rotates support plate 134 and the mounted wafer. Aperture 136 in the support plate functions to permit motion of a lift pin to facilitate wafer load/unload from the chuck.

Mask registration blocks 124 extend past vertical flats on the edge of the theta plate between each of the lobes with sufficient clearance to allow rotation of the theta plate. The blocks and mask registration pads as a group are set on a diameter greater than the diameter of the circular support plate 134 so that the mask registration pads 125 can extend outwardly from and above the plate 134 to abut and space a mask.

Figure 2:
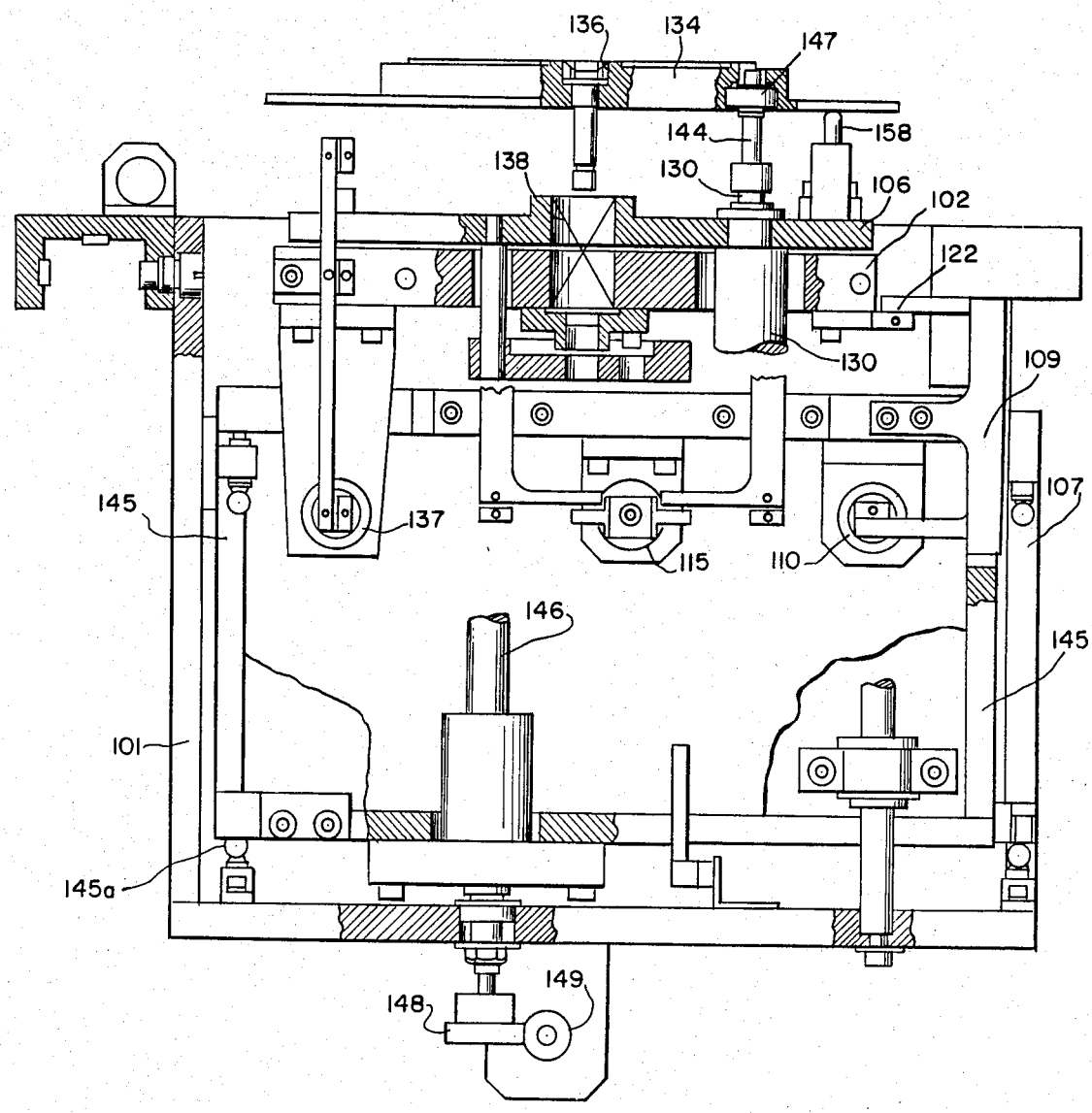
FIG. 2 is a partially cut-away sectional view of the apparatus taken from the left front side of FIG. 1.

FIG. 2 is a partial cross-sectional view showing detailed construction of the apparatus. Motors 110, 115 and 137 are mounted on a surface extending across walls 109 of the inner housing 145. The open-top housing 145 is moved for coarse alignment with respect to an outer open-top fixed box 107. It is raised and lowered by lead screw 146 driven by conventional electric motor 149 through gearing 148. A bottom stop 145 limits downward travel of housing 145. Except for a spherical bearing 147 in theta plate 134 which allows tilting of the support plate with respect to theta motors 128-130 all bearing or rotative movements employ flexure bearings. Flexures 144, connected to shafts 130a, etc., act as push-pull rods to move the support plate in the Z-direction and act as flexible beams when the motors 128-130 are differentially operated to tilt plate 134.

Figure 3:
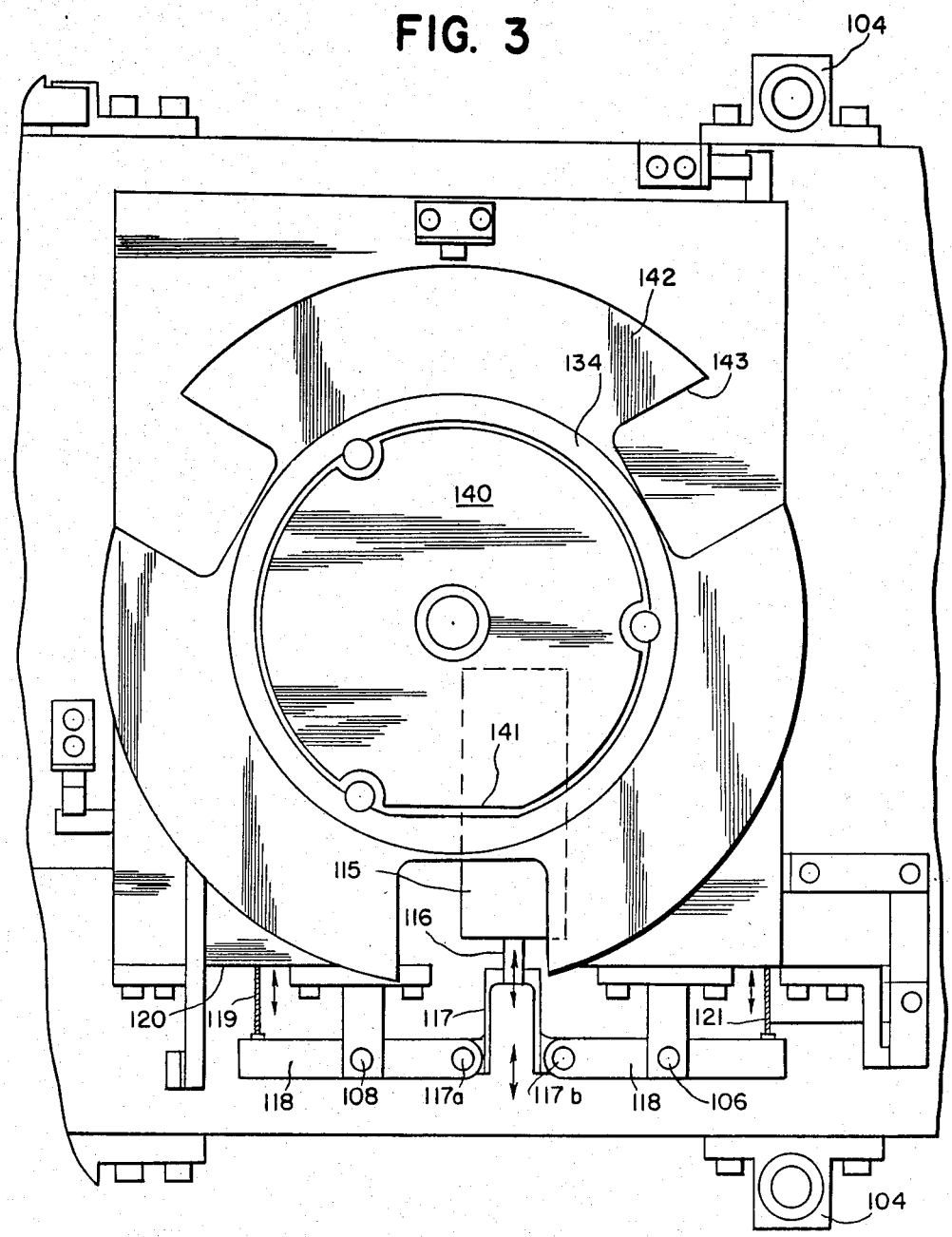
FIG. 3 is a top view of the alignment apparatus.

FIG. 3 shows a wafer 140 mounted on the top of the support plate. The plate and wafer have a registration flat 141 which assure proper initial registration of the wafer-to-the mask. Inward and outward movement of Y-axis motor 115 is seen by the arrows as well as a top view of the bell crank linkages 117 and 118 which actuate push-pull rods 119, 121. Guide-rod tabs 104 are also more clearly shown. Slots 143 for the mask registration blocks are provided in a cover plate that covers the annulus around the support plate to prevent ingress of dust particles and the like to the inner mechanisms.

Figure 4:
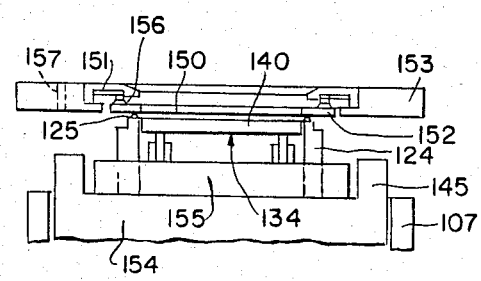
FIG. 4 is a side elevation schematic view showing the relationship of the six-axis wafer alignment apparatus with a mask and its aligner and the orientation of the mask registration means.

FIG. 4 illustrates the function of the mask registration pads 125 extending from the top of registration blocks 124. Pads 125 abut and space the outside frame 152 of the mask 150. A mask aligner 153 spaced above wafer 140 holds and adjusts mask 150 in x, y and θ directions. Frame 152 of the mask is mounted on a flexure 151 attached to the mask aligner 153. Wafer 140 is shown mounted on support plate 134 which is movable by stage assembly 155, as described above, in fine alignment. Small vacuum cups 156 extending on flexures 151 on aligner 153 hold the frame of the mask in position. The vertical location of the mask is not well defined until the stage is raised and the mask rests on the reference pads. Prior to raising the fine stage assembly, a gap control means such as that shown in U.S. Pat. Nos. 4,175,441 and 4,285,053 involving an acoustic method of measuring micron and submicron distances is employed. The means is inserted above the wafer and used to reference and set the top surface of the wafer and the mask reference pads.

The fine stage 155 which includes the mechanisms contained in stage housing 101 has been tested for 1 million cycles and has been found to be virtually maintenance free. The implementation of flexural pivots at all rotating joints yields a truly zero clearance bearing, permitting extreme accuracy and repeatability of position. The nature of the construction and the use of piezoelectric motors also results in a stage that has no particulate generating members in the vicinity of the wafer itself, a vital consideration in any lithography application. There are no critical adjustments required during the assembly and implementation of this stage and none of the fabrication techniques for any of the stage components are beyond the capabilities of a normal production machine shop.

The above description of the advantages and the preferred embodiment of this invention is intended to be illustrative only, and not limiting. Other embodiments of this invention will be apparent to those skilled in the art in view of the above disclosure.

I claim:

1. Alignment apparatus comprising:
means for supporting an object to be aligned, including
   a substantially planar support plate;
   a substantially rotatable plate positioned in a plane parallel to said support plate and having a spaced series of piezoelectric linear motors oriented perpendicular therewith, said motors each having a movable shaft adapted to abut and support a rear-side of said support plate for moving said support plate in the Z axis;
   a theta drive piezoelectric linear motor for rotatably moving said rotatable plate;
   a substantially planar x-y motion plate positioned in a plane parallel to said rotatable plate;
   first flexure means for connecting said rotatable plate to said x-y motion plate;
   a pair of piezoelectric motors connected to said x-y motion plate for driving said motion plate along x and y coordinates in the plane of said motion plate; and
   second flexure means for supporting said motion plate, all of said piezoelectric motors being adapted to be driven variously in off-on, in-out sequences to move said support plate in x, y, z and θ directions as necessary to orient said object to a desired spatial position.

2. The invention of claim 1 including means for activating said series of piezoelectric motors differentially for tilting said support plate with respect to said rotatable plate.

3. The invention of claim 1 in which said series of piezoelectric motors are mounted in a corresponding series of equi-spaced apertures in said rotatable plate.

4. The invention of claim 3 wherein said motion plate includes a series of equi-spaced apertures for receiving an end of said series of piezoelectric transducers.

5. The invention of claim 1 in which said object is a semiconductor wafer, mask or substrate and further including
a fixed stage housing surrounding support plate, said rotatable plate and said motion plate;
fixed spacing means extending from said housing above said support plate and said wafer for abutting a mask and initially setting the wafer-mask gap distance.

6. The invention of claim 1 further including
a fixed stage housing surrounding said support, rotatable and motion plates;
means for moving said housing, said support plate, said rotatable plate, said motion plate, said first and second flexure means and all of said piezoelectric motors into a coarse Z spacial portion.

7. The invention of claim 6 further including guide means for guiding said housing in a Z-direction.

8. The invention of claim 1 in which said x-y and theta piezoelectric motors are mounted under said motion plate and including linkage means actuatable by said motors connected to said motion plate and said rotatable plate, respectively.

9. The invention of claim 8 in which said linkage means are flexurally supported and pivoted.

10. The invention of claim 8 in which said linkage means comprise bell crank linkages.

11. The invention of claim 8 in which said x-y and theta piezoelectric motors are mounted in horizontal parallelism and said linkage means are attached to edge portions of said motion plate and said rotatable plate, respectively.

12. The invention of claim 1 including means for sensing and controlling the axial travel of said series of piezoelectric motors.

13. The invention of claim 12 in which said sensing means is a linear vaiable differential transformer.

14. The invention of claim 1 in which
said support plate is circular to receive an essentially circular semiconductor wafer;
said rotatable plate is trilobed with one of said series of piezoelectric motors passing through each of said lobes; and
said motion plate is essentially square.

15. The invention of claim 14 further including
upstanding vertical spaced mask registration means to orient said mounted wafer to a mask extending in a spaced plane above and essentially parallel to said support plate and wafer;
said x-y motion plate being apertured to receive said registration means;
said rotatable plate being dimensioned so that said registration means extends freely pass edge areas of said rotatable plate between said lobes; and
said support plate being dimensioned to have a diameter smaller than the diametrical spacing of said registration means.

16. The invention of claim 1 in which said second flexure means has sufficient stiffness to act as a push or pull rod when said y drive piezoelectric motor is driving outwardly or inwardly, respectively.

17. Alignment apparatus comprising
means for supporting an object to be aligned including
   a substantially planar support plate;
   a substantially planar X-Y motion plate positioned in a plane parallel to said support plate;
   means for connecting said motion plate to said support plate;
   a pair of piezoelectric motors;
   means for connecting said motors to X-Y motion plate for driving said motion plate along X-Y coordinates in the plane of said motion plate;
   flexure means supporting said motion plate; and wherein said connection means comprises flexurally pivoted bell crank linkages.

18. The invention of claim 17 in which said means for connecting said motion plate to said support plate comprises a rotatable theta plate in a plane parallel to the plane of said support plate and flexurally mounted to said motion plate, a third piezoelectric motor and a flexurally-mounted bell crank connected to said motor to rotate said theta plate.

19. The invention of claim 17 in which said means for connecting said motion plate to said support plate comprises a movable plate in a plane parallel to the plane of said support plane, a series of piezoelectric motors oriented perpendicular therewith, each motor having a movable shaft abutting and supporting said support plate for moving said support in the Z axis.

20. The invention of claim 15 wherein said apparatus is part of an X-ray lithography system.

* * * * *